(12) United States Patent
Polykarpov et al.

(10) Patent No.: US 6,638,678 B2
(45) Date of Patent: Oct. 28, 2003

(54) METHOD FOR IMPROVING SENSITOMETRIC RESPONSE OF PHOTOSENSITIVE IMAGING MEDIA EMPLOYING MICROCAPSULES

(75) Inventors: Alexander Y. Polykarpov, Mason, OH (US); Joseph C. Camillus, Centerville, OH (US); James A. Dowler, Kettering, OH (US); Julius D. King, Jr., Huber Heights, OH (US)

(73) Assignee: HSBC Bank USA, New York, NY (US); as Trustee of the Cycolor, Inc. 2003 Trust U/A ( * ) Notice: Subject to any disclaimer, the term of this patent is extended or adjusted under 35 U.S.C. 154(b) by 49 days.

(21) Appl. No.: 09/989,603

(22) Filed: Nov. 20, 2001

(65) Prior Publication Data

US 2003/0096187 A1 May 22, 2003

(51) Int. Cl.[7] .............................. G03C 5/00; G03C 7/00
(52) U.S. Cl. ....................... 430/138; 430/330; 503/201
(58) Field of Search ............................... 430/138, 330; 503/201, 227

(56) References Cited

U.S. PATENT DOCUMENTS

| | | |
|---|---|---|
| 3,672,935 A | 6/1972 | Miller et al. |
| 3,732,120 A | 5/1973 | Brockett et al. |
| 3,920,510 A | 11/1975 | Hatano et al. |
| 4,399,209 A | 8/1983 | Sanders et al. |
| 4,416,966 A | 11/1983 | Sanders et al. |
| 4,440,846 A | 4/1984 | Sanders et al. |
| 4,766,050 A | 8/1988 | Jerry |
| 4,772,530 A | 9/1988 | Gottschalk et al. |
| 4,772,541 A | 9/1988 | Gottschalk et al. |
| 4,800,149 A | 1/1989 | Gottschalk et al. |
| 4,842,980 A | 6/1989 | Gottschalk et al. |
| 4,864,356 A | 9/1989 | Asano et al. |
| 4,865,942 A | 9/1989 | Gottschalk et al. |
| 4,873,168 A | 10/1989 | Ruder et al. |
| 4,874,685 A | 10/1989 | Adair |
| 4,962,010 A | 10/1990 | Colyer et al. |
| 5,057,393 A | 10/1991 | Shanklin et al. |
| 5,100,755 A | 3/1992 | Shanklin |
| 5,112,752 A | 5/1992 | Johnson et al. |
| 5,126,781 A | 6/1992 | Tomizawa et al. |
| 5,178,985 A * | 1/1993 | Tsujimoto et al. .......... 430/138 |
| 5,283,015 A | 2/1994 | Hutchings et al. |
| 5,783,353 A | 7/1998 | Camillus et al. |
| 6,030,740 A | 2/2000 | Polykarpov |
| 6,077,810 A | 6/2000 | Imaeda |
| 6,080,520 A | 6/2000 | Polykarpov et al. |

FOREIGN PATENT DOCUMENTS

JP        4-359238 A   * 12/1992

* cited by examiner

*Primary Examiner*—John A. McPherson
(74) *Attorney, Agent, or Firm*—Thompson Hine LLP

(57) ABSTRACT

A method of improving the sensitometric response of a photosensitive imaging media under various humidity conditions including the steps of providing a photosensitive imaging media including an imaging layer comprising a developer material and a plurality of microcapsules encapsulating a photohardenable composition and a color former; image-wise exposing the imaging media to actinic radiation to form a latent image on the media; maintaining the imaging media containing the latent image at an elevated temperature; and developing the image.

19 Claims, 1 Drawing Sheet

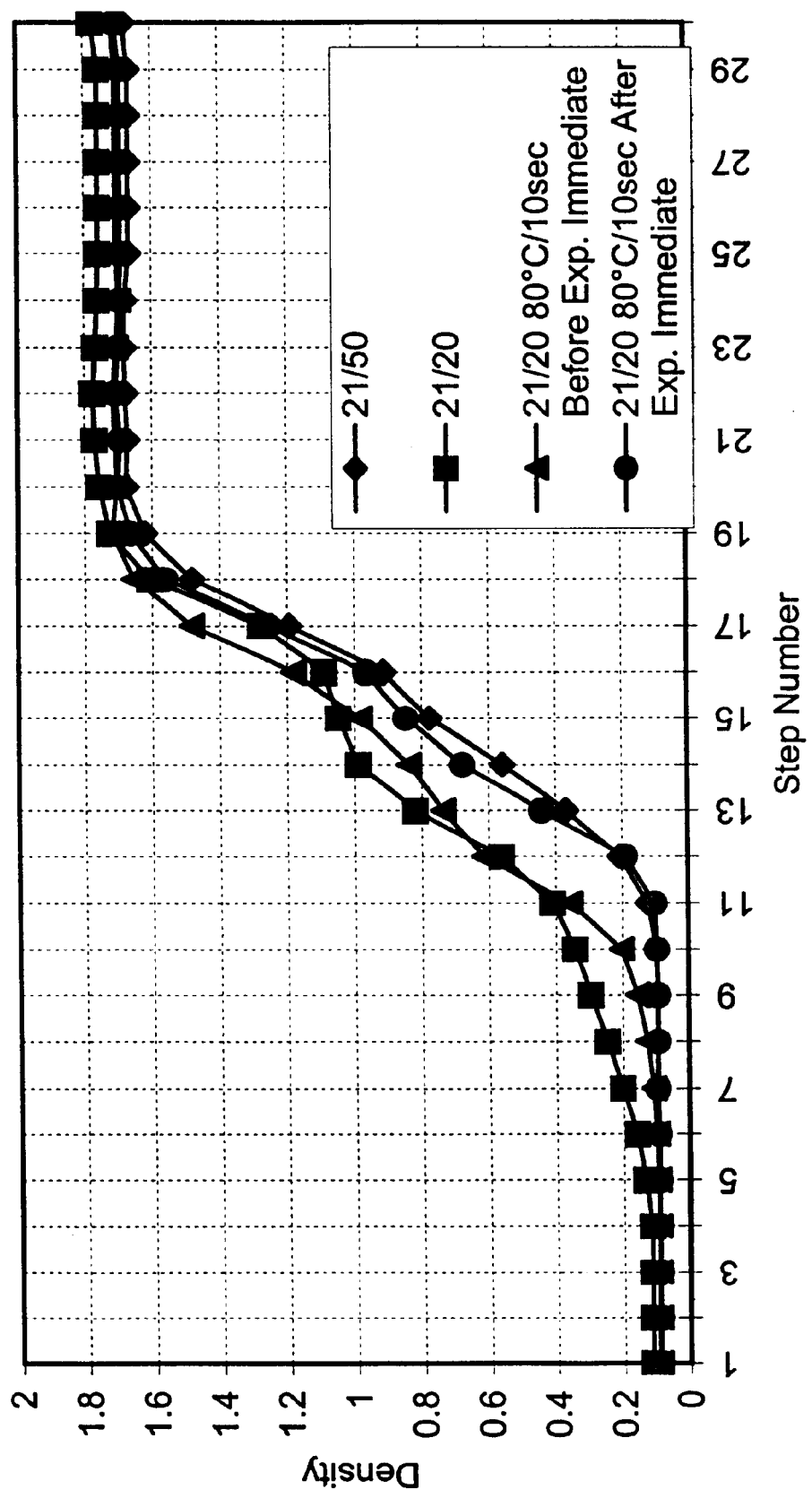

METHOD FOR IMPROVING SENSITOMETRIC RESPONSE OF PHOTOSENSITIVE IMAGING MEDIA EMPLOYING MICROCAPSULES

BACKGROUND OF THE INVENTION

The present invention relates to photosensitive imaging systems and, more particularly to a method of imaging photosensitive imaging media to improve its sensitometric response by increasing the media temperature during the period of time ("dark time stage") between image-wise exposure of the media and pressure development. While the method of the present invention is useful in improving imaging characteristics of photosensitive imaging media generally, it is believed to be particularly useful in improving the stability of the middle tone and toe sensitivities of the H&D curve of self-contained photosensitive media employing photosensitive microcapsules. It is believed that a photosensitive imaging media imaged in accordance with the present invention is less sensitive to changes in environmental conditions, particularly changes in humidity, and exhibits improved image retention with time.

Photohardenable imaging systems employing microencapsulated radiation sensitive compositions are the subject of commonly assigned U.S. Pat. Nos. 4,399,209; 4,416,966; 4,440,846; 4,766,050; 4,962,010 and 5,283,015. These imaging systems are characterized in that an imaging sheet including a layer of microcapsules containing a photohardenable composition in the internal phase is image-wise exposed to actinic radiation. In the most typical embodiments, the photohardenable composition is a photopolymerizable composition including a polyethylenically unsaturated compound and a photoinitiator and is encapsulated with a color former. Exposure to actinic radiation hardens the internal phase of the microcapsules. Following exposure, the imaging sheet is subjected to a uniform rupturing force by passing the sheet through the nip between a pair of pressure rollers. An image transfer system in which the developer material is coated on a separate substrate as a separate developer or copy sheet is disclosed in commonly assigned U.S. Pat. No. 4,399,209. A self-contained imaging sheet in which the encapsulated color former and the developer material are co-deposited on one surface of a single substrate as one layer or as two interactive layers is disclosed in commonly assigned U.S. Pat. No. 4,440,846. An imaging system comprising a support, a layer containing microcapsules, a layer of developer material, and a layer containing an opacifying agent is disclosed in commonly assigned U.S. Pat. No. 4,766,050. The opacifying agent can form a separate layer or can be part of the layer containing the microcapsules or both but is interposed between the microcapsules and the developer to hide the microcapsules when viewing the image.

U.S. Pat. No. 5,783,353, commonly assigned, discloses a self-contained imaging system wherein the imaging layer is sealed between two supports to form an integral unit. The laminated format is advantageous in that it can reduce oxygen and moisture permeation and improve stability of the media. U.S. patent application Ser. No., filed Jan. 16, 2001, discloses a self-contained photosensitive material which includes an imaging layer of photosensitive microcapsules and a developer on a support and a protective coating on the imaging layer.

U.S. Pat. No. 4,873,168 to Ruder, et al. discloses a non-enclosed image-forming system employing photosensitive microcapsules which are heat treated prior to developing. Ruder discloses heating the imaging sheet for a time period from 30 seconds to as long as 20 minutes to extend the dynamic range of the color forming. By contrast, the present invention relates to increasing the temperature of an enclosed imaging media during the dark time stage which effectively reduces the dynamic range. Accordingly, the structure of the photosensitive imaging media described in Ruder is different (open versus enclosed) and the impact of heating the photosensitive media on the sensitometric response is different as well.

U.S. Pat. No. 6,077,810 to Imaeda discloses heating a photosensitive print medium after pressure developing to improve toner qualities. Imaeda is directed solely to post-heating the image media after pressure development; there is no disclosure or discussion of heating the media during the dark time stage.

SUMMARY OF THE INVENTION

In accordance with the present invention, a method of imaging photosensitive imaging media to improve its sensitometric response by increasing the media temperature during the period of time ("dark time stage") between image-wise exposure of the media and pressure development is disclosed. In addition, the photosensitive imaging media which are prepared in accordance with the present invention exhibit improved image retention. Further, by utilizing the method of the present invention, humidity sensitivity of the photosensitive imaging media is reduced thereby producing more consistent and reliable images. The method of the present invention involves increasing the temperature of the imaging media during the dark time stage. This promotes better control of dye release, even under high speed printing conditions. This may be due to better crosslinking of the photohardenable polymer or to improved resistance of the microcapsule wall.

In one embodiment of the present invention, the method of imaging a photosensitive media to improve its sensitometric response includes the steps of providing a photosensitive imaging media including an imaging layer comprising a developer material and a plurality of microcapsules encapsulating a photohardenable composition and a color former; image-wise exposing the imaging media to actinic radiation to form a latent image on the media; heating the imaging media containing the latent image; and pressure developing the latent image.

In accordance with a particular embodiment of the present invention, the imaging media is heated to a temperature of above about 50° C. At temperatures above 80° C., the effect does not improve substantially. Accordingly, while higher temperatures can be used, there is generally not a need to use them. The imaging media may be heated for a heating time of from about 1 millisecond to 30 seconds depending upon the temperature and efficiency of the heating element. In some embodiments of the present invention, the imaging media is first heated and then allowed to cool before development.

In accordance with another embodiment of the present invention, the imaging media is heated before or during exposure and maintained at an elevated temperature both during exposure and the dark time stage. Again, it may be advantageous to allow the imaging media to equilibrate to a lower temperature prior to pressure development.

Dark time heating in accordance with the present invention is believed to be particularly useful in improving the sensitometric response of enclosed imaging media. Enclosed media refer to systems constructed either as a laminated self-contained sheet between two films or as a one base self contained sheet including a protective coating. These types of imaging systems when imaged in accordance with the present invention exhibit more consistent and more predictable photoimaging characteristics under varying environmental conditions. For example, sensitivity of the photosensitive media to changes in humidity from, e.g., 15% to 80% RH is reduced by dark time heating such that consistent print quality can be obtained over a range of humidity conditions.

BRIEF DESCRIPTION OF THE DRAWING

The FIGURE is a sensitometric response curve for various enclosed, self-contained photosensitive imaging media illustrating the difference between preheating and dark time heating for media conditioned at 20% RH as compared to control media at 50% RH. Referring to the FIGURE, cyan density with white light exposure is plotted against the exposure step.

DETAILED DESCRIPTION OF THE INVENTION

The present invention provides a method for improving sensitometric properties of photosensitive imaging systems, and in particular, in microencapsulated imaging systems such as those described in U.S. Pat. Nos. 4,399,209; 4,440,836; 5,783,353; 6,080,520 and 6,030,740. The method includes the steps of providing a photosensitive imaging media including an imaging layer comprising a developer material and a plurality of microcapsules encapsulating a photohardenable composition and a color former; imagewise exposing the imaging media to actinic radiation to form a latent image on the media; heating the imaging media containing the latent image; and pressure developing the latent image.

To initiate the method of the present invention, a photosensitive imaging media is provided. The photosensitive imaging media may be embodied in a self-contained copy sheet in which the encapsulated chromogenic material and the developer material are co-deposited on one surface of a single substrate as one layer or as two interactive layers or they are deposited on two supports in layers which can interact when the supports are juxtaposed; or it may be embodied in a transfer system in which the developer material is coated on a separate substrate as a separate developer or copy sheet. Both systems operate by photographic control of the access between the chromogenic material and the developer as previously described. Although it is believed that the present invention provides improvements in both transfer and self-contained imaging systems, the benefits of dark time heating will be more fully realized in self-contained systems, particularly those systems wherein the imaging layer is located between two supports or between a support and a protective top-coating.

In accordance with one embodiment of the invention, the imaging system is a sealed self-contained imaging media. This sealed format is advantageous because, depending on the nature of the supports, it may reduce the amount of oxygen and moisture permeating into the photohardenable material which may improve film speed and the stability of the image. The term "sealed" as used herein refers to a seal which is designed as a nontemporary seal which results in destruction of the imaging assembly if the seal is broken.

The peripheral edges of the self-contained assembly may be sealed additionally by any of the conventional means used to seal polymeric materials such as polyethylene terephthalate. For example, the edges of the films can be heat sealed together or they can be sealed by any other technique. In one embodiment, the PET is sealed using a heat sealing method such as a heat knife. In the self-contained imaging system, following capsule rupture, the chromogenic material and the developer are able to react to form a visible image in the unexposed areas. Gradual development of the visible image is observed following exposure and capsule rupture as the chromogenic material and developer migrate, mix and react on the face of the sheet.

In accordance with another aspect of the present invention, the photosensitive imaging media is located between two supports to provide an enclosed media that is not necessarily sealed along the peripheral edges of the assembly.

In another embodiment of the present invention, the photosensitive imaging media is a self-contained photosensitive material which includes an imaging layer of photosensitive microcapsules and a developer on a support and a protective coating on the imaging layer. The protective coating layer serves many of the same functions as the second support in a sealed self-contained imaging system.

The imaging systems of the present invention utilize microcapsules to carry the image forming components. The operational center of the imaging system is the encapsulate or internal phase of the coating composition. The internal phase comprises a chromogenic material and a photohardenable composition.

The internal phase preferably includes a diisocyanate or polyisocyanate compound which functions as a pre-wall reactant. As is known in the art, the polyisocyanate compound is capable of reacting with the water from the aqueous phase by polycondensation to form a thin layer of a polyurea polymer around the internal phase. A particularly preferred polyisocyanate is Desmodur N-100, a biuret of hexamethylene diisocyanate and water available from Mobay Chemical Company. Other isocyanates, such as SF-50, manufactured by Union Carbide may be used in this invention. The polyisocyanate is typically added in an amount of about 2 to 15 parts per 100 parts of internal phase.

Typically, the photosensitive composition includes a photoinitiator and a substance which undergoes a change in viscosity upon exposure to light in the presence of the photoinitiator. That substance may be a monomer, dimer, oligomer or mixture thereof which is polymerized to a higher molecular weight compound or it may be a polymer which becomes cross-linked.

Typically, the substance which undergoes a change in viscosity is a free radical addition polymerizable or crosslinkable compound. The most typical example of a free radical addition polymerizable or crosslinkable compound useful in the present invention is an ethylenically unsaturated compound and, more specifically, a polyethylenically unsaturated compound. These compounds include both monomers having one or more ethylenically unsaturated groups, such as vinyl or allyl groups, and polymers having terminal or pendant ethylenic unsaturation. Such compounds are well known in the art and include acrylic and methacrylic esters of polyhydric alcohols such as trimethylolpropane, pentaerythritol, and the like; and acrylate or methacrylate terminated epoxy resins, acrylate or methacrylate terminated polyesters, etc. Representative examples include ethylene glycol diacrylate, ethylene glycol dimethacrylate, trimethylolpropane triacrylate (TMPTA), pentaerythritol tetraacrylate, pentaerythritol tetramethacrylate, dipentaerythritol hydroxypentacrylate (DPHPA), hexanediol-1,6-dimethacrylate, and diethylene glycol dimethacrylate.

The radiation curable or depolymerizable material usually makes up the majority of the internal phase. A radiation curable material must be present in an amount sufficient to immobilize the chromogenic material upon exposure. Typically these materials constitute 40 to 99 wt % of the internal phase (based on the weight of the oil solution containing the chromogen, the photosensitive composition and the carrier oil when present).

In some embodiments, it has been found desirable to dilute the photosensitive composition with a carrier oil to improve half-tone gradation. In these cases a carrier oil is present in the amounts disclosed below and the aforesaid materials make up to 40 wt % of the internal phase.

The chromogenic materials used in the present invention are those chromogenic materials conventionally used in carbonless paper. In general, these materials are colorless electron donating type color formers which react with a developer compound to generate a dye. Representative examples of such color formers include substantially colorless compounds having in their partial skeleton a lactone, a lactam, a sultone, a spiropyran, an ester or an amido structure. Specifically, there are triarylmethane compounds, bisphenylmethane compounds, xanthene compounds, thiazine compounds, spiropyran compounds and the like. Typical examples of them include Crystal Violet lactone, benzoyl leuco methylene blue, Malachite Green Lactone, p-nitrobenzoyl leuco methylene blue, 3-dialkylamino-7-dialkylamino-fluoran, 3-methyl-2,2'-spirobi(benzo-f-chrome), 3,3-bis(p-dimethylaminophenyl)phthalide, 3-(p-dimethylaminophenyl)-3-(1,2dimethylindole-3-yl) phthalide, 3-(p-dimethylaminophenyl)-3-(2-methylindole-3-yl)phthalide, 3-(p-dimethylaminophenyl)-3-(2-phenylindole-3-yl)phthalide, 3,3-bis(1,2-dimethylindole-3-yl)-5-dimethylaminophthalide, 3,3-bis-(1,2-dimethylindole-3-yl)6-dimethylaminophthalide, 3,3-bis-(9-ethylcarbazole-3-yl)-5-dimethylaminophthalide, 3,3-bis(2-phenylindole-3-yl)-5-dimethylaminophthalide, 3-p-dimethylaminophenyl-3-(1-methyl pyrrole-2-yl)-6-dimethylaminophthalide, 4,4'-bis-dimethylaminobenzhydrin benzyl ether, N-halophenyl leuco Auramine, N-2,4,5-trichlorophenyl leuco Auramine, Rhodamine-B-anilinolactam, Thodamine-(p-nitroanilino) lactam, Rhodamine-B-(p-chloroanilino)lactam, 3-dimethylamino-6-methoxyfluoran, 3-diethylamino-7-methoxyfluoran, 3-diethylamino-7-chloro-6-methylfluoroan, 3-diethylamino-6-methyl-7-anilinofluoran, 3-diethylamino-7-(acetylmethylamino)fluoran, 3-diethylamino-7-(dibenzylamino)fluoran, 3-diethylamino-7-(methylbenzylamino)fluoran, 3-diethylamino-7-(chloroethyhnethylamino)fluoran, 3-diethylamino-7-(diethylamino)fluoran, 3-methyl-spiro-dinaphthopyran, 3,3'-dichloro-spiro-dinaphthopyran, 3-benzyl-spiro-dinaphthopyran, 3-methyl-naphtho-(3-methoxybenzo)-spiropyran, 3-propylspiro-dibenzoidipyran, etc. Mixtures of these color precursors can be used if desired. Also useful in the present invention are the fluoran color formers disclosed in U.S. Pat. No. 3,920,510, which is incorporated by reference. In addition to the foregoing dye precursors, fluoran compounds such as disclosed in U.S. Pat. No. 3,920,510 can be used. In addition, organic compounds capable of reacting with heavy metal salts to give colored metal complexes, chelates or salts can be adapted for use in the present invention.

In accordance with the invention, the chromogenic material is incorporated in the internal phase in an amount sufficient to produce a visible image of the desired density upon reaction with the developer. In general, these amounts range from approximately 0.5 to about 20.0 percent based on the weight of the internal phase solution (e.g., monomer or monomer and oil) containing the chromogen. A preferred range is from about 2 percent to about 7 percent. The amount of the chromogenic material required to obtain suitable images depends on the nature of the chromogen, the nature of the internal phase, and the type of imaging system. Typically less chromogenic material is used in the internal phase of a self-contained imaging system in comparison to a transfer system. This is because the developer material is co-deposited on a common substrate with the chromogenic encapsulate and there is a tendency for the chromogenic material to diffuse through the capsule wall and react with the developer material during storage and because there is no inherent loss in transfer.

In addition to the chromogenic material and the photosensitive material, the internal phase of the present invention may also include a carrier oil to affect and control the tonal quality of the images obtained. While tonal quality (half-tone gradation) is not critical when copying printed documents, it is an important factor in faithfully reproducing pictorial images. In some cases where trimethylolpropane triacrylate is used in the radiation curable material, 20% of a carrier oil such as brominated paraffin improves tonal qualities. Preferred carrier oils are weakly polar solvents having boiling points above 170° C. and preferably in the range of 180° C. to 300° C. The carrier oils used in the present invention are typically those conventionally used in carbonless paper manufacture. These oils are generally characterized by their ability to dissolve Crystal Violet Lactone in a concentration of 0.5 wt % or more. However, a carrier oil is not always necessary. Whether a carrier oil should be used will depend on the solubility of the chromogenic material in the photosensitive composition before exposure, the nature of the chromogenic material and the viscosity of the characteristics of the internal phase. When present, examples of carrier oils are alkylated biphenyls (e.g., monoisopropylbiphenyl), polychlorinated biphenyls, castor oil, mineral oil, deodorized kerosene, naphthenic mineral oils, dibutyl phthalate, dibutyl fumerate, brominated paraffin and mixtures thereof. Alkylated biphenyls are generally preferred.

Various photoinitiators can be selected for use in the present invention. These compounds absorb the exposure radiation and generate a free radical alone or in conjunction with a sensitizer. Conventionally, there are homolytic photoinitiators which cleave to form two radicals and initiators which radiation converts to an active species which generates a radical by abstracting a hydrogen from a hydrogen donor. There are also initiators which complex with a sensitizer to produce a free radical generating species and initiators which otherwise generate radicals in the presence of a sensitizer. Both types can be used in the present invention. If the system relies upon ionic polymerization to tie up the chromogen, the initiator may be the anion or cation generating type depending on the nature of the polymerization. Where, for example, ultraviolet sensitivity is desired, as in the case of direct transmission imaging using ultraviolet light, suitable photoinitiators include α-alkoxy phenyl ketones, O-acylated-α-oximinoketones, polycylic quinones, benzophenones and substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones, haloalkanes, α-halo-α-phenylacetophenones; photoreducible dye-reducing agent redox couples, halogenated paraffins (e.g., brominated or chlorinated paraffin) and benzoin alkyl ethers. Specific photoinitiators useful in the present invention include: α-alkoxyketone, α,α-dialkoxyketone, benzophenone, xanthane, chloroxanthanone, chloromethylxanthanone, chlorosulfoxylxanthanone, thioxanthanone, chloroxanthanone, chloromethylthioxanthanone, chlorosulfonylthioxanthanone, chloromethylnaphthalene, chlorosulfonylnaphthalene, chloromethylanthracene, chlorosulfonylanthracene, chloromethylbenzoxazole, chloromethylbenzothiazole, chloromethylbenzimidazole, chlorosulfonylbenzoxazole, chlorosulfonylbenzothiazole, chlorosulfonylbenzimidazole, α-methylquinoline, α-chlorosulfonylquinoline, α-chloromethylbenzophenone, α-chlorosulfonylbenzophenone, α-chloromethylfluorenone, achlorosulfonylfluorenone, carbon tetrabromide, benzoin methyl ether, benzoin ethyl ether, desyl amine, methylene blue/ascorbic acid, chlorinated aliphatic hydrocarbons and combinations thereof. The sensitivity among these compounds can be shifted by adding substituents such that the compounds generate radicals when exposed to the desired radiation wavelength.

The photoinitiator is present in the internal phase in an amount sufficient to initiate polymerization or cross-linking within a short exposure time. Using benzoin methyl ether as an example, this photoinitiator is typically present in an amount of up to 10% based on an amount of radiation curable material in the internal phase. Naturally, the amount varies depending on the nature of the other components of the photosensitive composition.

Particularly useful as photoinitiators in the present invention are cationic dye-borate anion complexes as disclosed in commonly assigned U.S. Pat. Nos. 5,112,752; 5,100,755; 5,057,393; 4,865,942; 4,842,980; 4,800,149; 4,772,530 and 4,772,541 which are incorporated herein by reference. When employed as a photoinitiator in the present invention, the cationic dye-borate anion complex is usually used in an amount up to about 1% by weight based on the weight of the photopolymerizable or crosslinkable species in the photohardenable composition. More typically, the cationic dye-borate anion complex is used in an amount of about 0.2% to 0.5% by weight. While the cationic dye-borate anion complex can be used alone as the initiator, film speeds tend to be quite low and oxygen inhibition is observed.

The beneficial effects of dark time heating are particularly noted when the photosensitive composition includes a photoinitiator containing a thiol as described in commonly assigned U.S. Pat. No. 4,874,685 which is incorporated therein by reference. Representative examples of thiols useful in the present invention are mercaptobenzoxazole, ethoxymercaptobenzothiazole, mercaptobenzothiazole and 1-phenyl-5-mercaptotetrazole.

In accordance with one embodiment of the invention, a full color imaging system is provided in which the microcapsules are in three sets respectively containing cyan, magenta and yellow color formers respectively sensitive to red, green, and blue light respectively. For good color balance, the visible-sensitive microcapsules are sensitive (λ max) at about 450 nm, 540 nm, and 650 nm, respectively. Such a system is useful with visible light sources in direct transmission or reflection imaging. Such a material is useful in making contact prints, projected prints of color photographic slides, or in digital printing. They are also useful in electronic imaging using lasers or pencil light sources of appropriate wavelengths. Because digital imaging systems do not require the use of visible light, sensitivity can be extended into the UV and IR. Accordingly, the sensitivity can be extended into the IR and/or UV to spread the absorption spectra of the photoinitiators and avoid cross-sensitization.

The developer materials employed in carbonless paper technology are useful in the present invention. Illustrative examples are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts of aromatic carboxylic acids or derivatives thereof such as zinc salicylate, tin salicylate, zinc 2-hydroxy napththoate, zinc 3,5 di-tert butyl salicylate, zinc 3,5-di-(αmethylbenzyl) salicylate, oil soluble metals salts or phenol-formaldehyde novolak resins (e.g., see U.S. Pat. Nos. 3,672,935 and 3,732,120) such as zinc modified oil soluble phenol-formaldehyde resin as disclosed in U.S. Pat. No. 3,732,120, zinc carbonate etc. and mixtures thereof. The particle size of the developer material is important to obtain a high quality image. The developer particles should be in the range of about 0.2 to 3 microns and, preferably in the range of about 0.5 to 1.5 microns. A suitable binder such as polyethylene oxide, polyvinyl alcohol, polyacrylamide, acrylic latices, neoprene emulsions, polystyrene emulsions, and nitrile emulsions, etc. may be mixed with the developer and the microcapsules, typically in an amount of about 1 to 8% by weight, to prepare a coating composition.

A preferred developer material is one which has excellent compatibility with the microcapsule slurry solution. Specific examples of useful developers, which have good stability include phenolic resins from Schenectady International, such as HRJ-4250 and HRJ-4542.

The microcapsules used in the present invention can be produced using known encapsulation techniques including coacervation, interfacial polymerization, polymerization of one or more monomers in an oil, as well as various melting, dispersing and cooling methods. The capsule forming material used in a given imaging system is selected based on the photosensitive composition present in the encapsulate. Thus, the formed capsule wall must be transmissive to the exposure radiation. Melamine-formaldehyde capsules are preferred.

The mean size of the capsules used in the present invention may vary over a broad range but generally ranges from approximately 1 to 10 microns. As a general rule, image resolution improves as the capsule size decreases with the caveat that if the capsule size is too small, the capsule may sit within incongruities in the support and the support may screen the capsules from exposure. Very small capsules may also fail to rupture upon the application of pressure. In view of the foregoing, it has been found that a preferred mean capsule size range is approximately 1 to 10 microns and particularly approximately 1 to 5 microns.

The photosensitive imaging media is then exposed to actinic radiation such that the microcapsules are image-wise exposed to form a latent image. As used herein, the term "actinic radiation" encompasses wavelengths in the ultraviolet spectral region, visible region and infrared spectral region. Typically, the actinic radiation source will be ultraviolet or visible wavelengths. The exposure to actinic radiation causes the encapsulated radiation curable composition to polymerize thereby preventing release of the image-forming chromogenic composition.

In accordance with some aspects of the present invention, the photosensitive imaging media can be heated before and/or during the exposure step as well as during the dark time after exposure. Typically, the media will be allowed to equilibrate to a lower temperature prior to pressure development so that maximum color densities can be obtained. Heating the photosensitive media during exposure can be accomplished by using an oven, heated forced air, etc. In accordance with one aspect of the present invention, the media can be heated with a heating strip or plate located under the exposure mechanism. The media can be heated at a predetermined temperature while being exposed and during the dark time stage.

After exposure and prior to development, the photosensitive imaging media is heated to improve photoimaging characteristics. Heating of the media can be accomplished using an oven, heated forced air, thermal head, heating strip or plate, etc. The photosensitive imaging material will typically be heated at a temperature of at least 50° C. A typical temperature range is between about 50° C. and 80° C. Temperatures of about 80° C. are preferable.

The duration of the heating step depends upon the specific microcapsule formulation, the heating temperature and the imaging equipment. Typically, the imaging media will be heated for a period of time from about 1 ms to 30 s with a more specific range of between about 1 to 20 s. Higher temperatures can be used over shorter durations to obtain optimum photofunctionals. Media preconditioned at low humidity may require higher temperatures or longer duration of heating to achieve optimum performance characteristics.

In accordance with a particular embodiment of the present invention, the imaging media is allowed to equilibrate to a lower temperature after heating during the dark time stage and prior to pressure development. Pressure developing at a lower temperature is believed to be a factor in attaining maximum color densities. Typically, the imaging media will be allowed to cool to a temperature of from 20° C. to 40° C., more typically of about room temperature (25° C.).

After the imaging media has been image-wise exposed and heated, the microcapsules on the imaging media are subjected to a uniform rupturing force to rupture the microcapsules in the non-exposed and partially exposed areas to release the encapsulated chromogenic materials which react with the developer thereby developing the image. Typically, capsule rupture is effected by the application of pressure to the imaging sheet using pressure rollers. Alternative means of capsule rupture can also be used. For example, systems are envisioned in which the capsules are ruptured ultrasonically, thermally, or by solvent.

Photosensitive imaging media imaged in accordance with the present invention by heating the media during the dark time stage exhibit improved sensitometric response. Although not wishing to be bound by theory, it is believed that one of the benefits of the dark time heating step is increased crosslinking density of the polymer that forms inside the exposed microcapsules. The higher crosslink density ensures better control of dye release and, consequently, higher image quality. Heating the imaging media after exposure compensates for the shorter dark time associated with faster printer speeds. Sensitometric response curves generated for media imaged in accordance with the present invention show improved D50 to toe sensitivities and increased linearity. The dark time heating effectively reduces the dynamic range. The improved sensitometric response facilitates color correction because there are fewer distortions in the H & D curve shape that have to be accounted for during imaging. Other advantages associated with the dark time heating include reduced sensitivity to changes in humidity and improved image retention.

The figure is a graph illustrating the sensitometric response for media imaged in accordance with the present invention compared to media preheated before exposure and media without any heating step. Cyan density with white light exposure is plotted against the exposure levels. The graph also illustrates the impact of humidity on the response curve. The media conditioned at 20% RH is considerably slower than the media conditioned at 50% RH. Preheating the media conditioned at 20% RH at a temperature of 80° C. before image-wise exposure causes only a slight shift in the toe area of the curve. By contrast, dark time heating at the same temperature causes both the toe and midtone areas of the curve to shift to faster speeds. Dark time heating of the media conditioned at 20% RH provides a sensitometric response approaching that of the media conditioned at 50% RH. The ability to provide an imaging media having similar sensitometric responses over a wide range of humidity conditions is essential to producing high quality images from a printer being used under different environmental conditions. Accordingly, dark time heating of photosensitive media is better than preheating before exposure with respect to decreasing sensitivity to humidity changes.

Having described the invention in detail and by reference to preferred embodiments thereof, it will be apparent that modifications and variations are possible without departing from the scope of the invention defined in the appended claims.

What is claimed is:

1. A method for improving the sensitometric response of a photosensitive imaging media under a range of humidity conditions comprising the steps of:

providing an enclosed photosensitive imaging media including an imaging layer comprising a developer material and a plurality of microcapsules encapsulating a photohardenable composition and a color former;

image-wise exposing the imaging media to actinic radiation to form a latent image on the media;

maintaining the imaging media containing the latent image at an elevated temperature; and developing the image.

2. The method according to claim 1 wherein said maintaining step comprises maintaining said imaging media at a temperature of about 50° C. or above.

3. The method according to claim 2 wherein said maintaining step comprises maintaining said imaging media at a temperature of from about 50° C. to 80° C.

4. The method of claim 2 wherein said maintaining step comprises maintaining said imaging media at said elevated temperature for a time period of from about 1 ms to 30 seconds.

5. The method of claim 4 wherein said time period is approximately 10 seconds.

6. The method of claim 1 wherein said imaging media is allowed to cool after said heating step to a temperature of from about 20° C. to 40° C. prior to said development step.

7. The method of claim 6 wherein said imaging media is allowed to cool to a temperature of about 25° C.

8. The method of claim 1 wherein said image-wise exposure step comprises exposing said imaging media at a temperature of from about 50° C. or above.

9. The method of claim 8 wherein said imaging media is exposed at a temperature of about 80° C.

10. The method of claim 8 wherein said imaging media is maintained at a temperature of from about 50° C. or above during said image-wise exposure step and said maintaining step.

11. The method of claim 10 wherein said imaging media is maintained at a temperature of about 80° C.

12. The method of claim 1 wherein said photosensitive imaging media is a sealed self-contained imaging system comprising an imaging layer disposed between a pair of supports.

13. The method of claim 1 wherein said photosensitive imaging media is a self-contained imaging system comprising an imaging layer on a support and a protective coating on said imaging layer.

14. In a method of forming an image on an enclosed, self-contained photosensitive imaging media comprising an imaging layer disposed between a pair of supports wherein, said imaging layer including photosensitive microcapsules and a developer, said microcapsules including an internal phase containing a photohardenable composition and a chromogenic material wherein said method comprises image-wise exposing said photosensitive media to actinic radiation and rupturing said microcapsules, wherein said chromogenic material image-wise reacts with said developer to form a color image, the improvement wherein said method further comprises the steps of heating said photosensitive imaging media after image-wise exposing said media and prior to rupturing said microcapsules.

15. The method according to claim 14 wherein said heating step comprises heating said imaging media at a temperature of from about 50° C. to 80° C.

16. The method of claim 15 wherein said heating step comprises heating said imaging media for a time period of from about 1 ms to 30 s.

17. The method of claim 14 wherein said image-wise exposure step comprises exposing said imaging media at a temperature of from about 50° C. to 80° C.

18. The method of claim 17 wherein said imaging media is maintained at a temperature of from about 50° C. to 80° C. during said image-wise exposure step and said heating step.

19. The method of claim 17 wherein said imaging media is maintained at a temperature of about 80° C.

* * * * *